United States Patent [19]

Moriya et al.

[11] 4,374,193

[45] Feb. 15, 1983

[54] PHOTOSENSITIVE MATERIAL AND PROCESS FOR DEVELOPING THE SAME

[75] Inventors: Takeo Moriya, Kawagoe; Toshio Yamagata, Urawa, both of Japan

[73] Assignee: Kimoto & Co., Ltd., Japan

[21] Appl. No.: 258,771

[22] Filed: Apr. 29, 1981

[30] Foreign Application Priority Data

May 16, 1980 [JP] Japan .................................. 55-65044

[51] Int. Cl.$^3$ .......................... G03C 1/60; G03C 5/34; G03C 5/18; G03F 7/08
[52] U.S. Cl. .................................... 430/149; 430/145; 430/157; 430/176; 430/292; 430/294; 430/326
[58] Field of Search ............... 430/175, 176, 326, 325, 430/292, 294, 149, 145, 157

[56] References Cited

U.S. PATENT DOCUMENTS

| | | | |
|---|---|---|---|
| 2,405,523 | 8/1946 | Sease et al. | 430/176 |
| 2,551,133 | 5/1951 | Jennings et al. | 430/181 |
| 2,937,085 | 5/1960 | Seven et al. | 430/302 |
| 3,544,317 | 12/1970 | Yonezawa | 430/176 |
| 3,778,270 | 12/1973 | Roos | 430/326 |
| 3,847,614 | 11/1974 | Mattor | 430/176 |
| 4,193,797 | 3/1980 | Cohen et al. | 430/326 |
| 4,296,193 | 10/1981 | Moriya et al. | 430/149 |

OTHER PUBLICATIONS

Derwent Abstract, Abstract No. 00517T-AG, (W. Germany-#2130283, 12/1971).

English Translation Submitted with Paper No. 7 of Japanese Patent Publication 50-8658, 4/1975, Asano.

*Primary Examiner*—Charles L. Bowers, Jr.
*Attorney, Agent, or Firm*—Kenway & Jenney

[57] ABSTRACT

A positive-working photosensitive material and a process for developing the same are disclosed.

The positive-working photosensitive material is obtained by forming on a base material a layer of a photosensitive composition containing (A), 100 weight parts of a resin binder including a vinylic polymer compound having phenolic hydroxyl groups and (B), 3–30 weight parts of an aromatic diazonium salt having only a single diazo group.

The positive-working photosensitive material is developed by using an aqueous alkali solution.

7 Claims, No Drawings

PHOTOSENSITIVE MATERIAL AND PROCESS FOR DEVELOPING THE SAME

BACKGROUND OF THE INVENTION

(1) Field of the Invention

This invention relates to an improvement in a positive type photosensitive material and to a process for developing the same, and more particularly to a photosensitive material which is able to form an excellent color-developed positive relief image by developing the exposed photosensitive material with an aqueous alkali solution and washing it with water. The invention also relates to flexible and tough image film which can be stripped off from a base material as occasion demands, as to well as a process for developing the same.

(2) Description of the Prior Art

In the past, the following processes have been employed to obtain a positive relief image using ultraviolet rays as a light source.

(1) A layer of photosensitive composition consisting of a o-quinonediazide derivative and alkali soluble resin binder (e.g. novolak resin) is formed on a base material to obtain a photosensitive reproduction material. The photosensitive reproduction material thus obtained is exposed and the exposed areas are alkali-developed.

(2) A layer of photosensitive composition consisting of a reaction product of p-diazodiphenylamine with phosphotungstic acid and a vinylidene chloride-acrylonitrile copolymer binder is formed on a base material to obtain a photosensitive reproduction material. The photosensitive reproduction material thus obtained is exposed and the exposed areas are developed by using a water-alcohol solution (see Japanese patent publication No. 42-14326, claiming priority of U.S. Appln. Ser. No. 345,848 filed Feb. 19, 1964).

(3) A layer of photosensitive composition consisting of an ethylenically unsaturated compound, a thermoplastic polymer, a photopolymerization initiator, and a dye or pigment is formed between two sheets of supports to obtain a photosensitive reproduction material. The photosensitive reproduction material thus obtained is subjected to development/peel procedure utilizing the change of adhesive strength in the exposed areas, and a relief image is formed by the remaining photosensitive composition (see U.S. Pat. No. 3,060,023).

(4) A positive relief image is obtained by using a photoresist composition containing as main components an o-quinonediazide compound and an alkali-soluble vinylic polymer compound having phenolic hydroxyl groups and represented by the general formula:

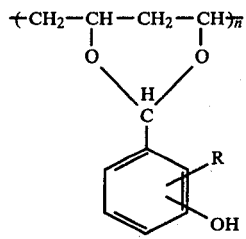

wherein R represents hydrogen, hydroxyl, carboxyl, alkyl, alkoxyl, aryl, nitro, amino or halogen (see Japanese patent publication No. 50-8658).

However, these prior art processes have the following disadvantages and are insufficient to obtain images having high density and high resolving power.

With regard to the above-mentioned process (1), the binder resin can be dyed only with difficulty. Further, it is difficult to combine the binder resin with an efficient color developing mechanism. For this reason, a dye or pigment is usually dispersed in the binder resin and in order to obtain high light shielding density, a long period of exposure is necessary and therefore, impractical.

In the above-mentioned process (2), high light shielding density can be obtained without decreasing sensitivity by providing a light shielding layer on the photosensitive layer which is formed on a transparent base material, but in this case exposure can be made only from the transparent base material side and a decrease in resolving power due to the thickness of the base material is unavoidable.

Further, the above-mentioned process (3) has the same disadvantage as the process (2), because exposure is made through the transparent base material. Besides, since development is made by agglutination and destruction of the photosensitive layer, resolving power is reduced. Another disadvantage in the process (3) is in that the price of the photosensitive material is high.

The above-mentioned process (4) can give a positive relief image by alkali-development, but it has a disadvantage that no color development is observed and no image having high density can be obtained.

SUMMARY OF THE INVENTION

The present inventors have studied the above-mentioned disadvantages of the prior art and have discovered a photosensitive material which, when exposed and alkali-treated, provides exposed areas which are removable in water wash and unexposed areas which are hardened to form a positive image. The novel photosensitive composition is a combination of (A), a resin binder containing as a main component an alkali-soluble vinylic polymer compound having phenolic hydroxyl groups and represented by the general formula:

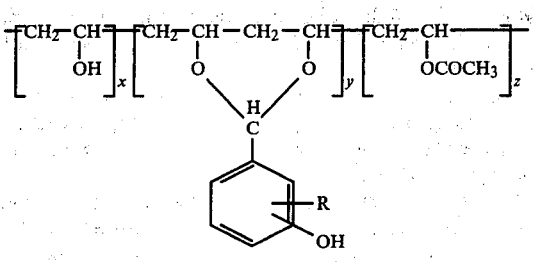

and (B), an aromatic diazonium salt.

Accordingly, an object of the present invention is to provide a photosensitive material which forms an excellent color-developed positive relief image, and also to give a flexible and tough image film which can be stripped off from a base material as occasion demands.

A further object is to provide a process for developing the photosensitive material.

These and other objects of the invention will become apparent from the following description of embodiments thereof.

DETAILED DESCRIPTION OF THE PREFERRED EMBODIMENTS OF THE INVENTION

The above-mentioned objects of the present invention have been achieved by discovery of a positive-working photosensitive material which is obtained by forming on a base material a layer of a photosensitive composition comprising (A), 100 weight parts of a resin binder containing at least 50 weight % of a vinylic polymer compound having an average polymerization degree of 300–2600 and represented by the general formula:

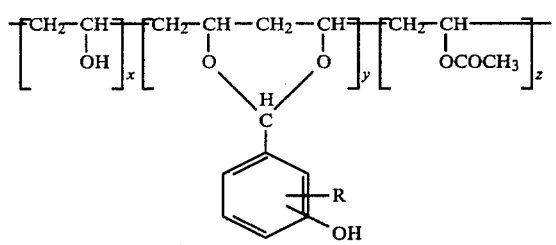

wherein R represents hydrogen atom, hydroxyl, carboxyl, alkyl, alkoxyl, aryl, nitro, amino group or halogen atom; and the copolymerization ratio of x:y:z is 5–50:5–85:10–60 and (B), 3–30 weight parts of an aromatic diazonium salt having only a single diazo group. The invention also provides a process for developing said photosensitive material with an alkali.

A remarkable characteristic of the present invention is in that a positive image is formed and simultaneously color-developed by alkali development.

The mechanism of said color development is not clear, but it is presumed from the structure of the vinylic polymer compound that said color development is based on a coupling reaction of the aromatic diazonium salt with the aromatic ring having a phenolic hydroxyl group under alkaline conditions.

The tone of this developed color depends on the combination of the resin binder and the diazonium salt used, but almost all combinations show an absorption ranging from the short wavelength of visible light to ultraviolet light. This means color development covering almost all of the photosensitive wavelength areas of the diazonium salt. A relief image having high density can be formed effectively using an extremely simple composition.

The reason why the copolymerization ratio and molecular weight of the vinylic polymer compound (A) in the present invention are restricted to the above ranges above is as follows.

When x is lss than 5, the permeation of a developing solution into the photosensitive material is decreased to the point of hindering color development. Conversely, when x is more than 50, the unexposed areas show a decreased resistance to the developing solution and may be removed during development or water washing.

In cases where y is less than 5, an alkali-soluble resin can not be obtained and color development is decreased. On the other hand, in cases where y is more than 85, x and/or z is decreased and the effects of the vinyl alcohol component and/or vinyl acetate component are diminished.

Further, if z is less than 10, the water resistance of the photosensitive material is lowered. Reversely, if z is more than 60, the solubility of the exposed areas in the developing solution is reduced, resulting in difficulty of development.

Furthermore, if the average polymerization degree is less than 300, the unexposed areas show a reduced resistance to the developing solution and removal during development. On the other hand, if z is more than 2600, the photosensitive coating solution shows an extremely high viscosity and the control of the viscosity becomes difficult.

According to the present invention, the vinylic polymer compound (A) can be used alone as the resin binder or in combination with 50 weight % or less of other compatible resins. Examples of these resins are alkali-soluble resins such as phenol novolak resin and cresol novolak resin as well as vinyl acetate resin.

Examples of the water soluble diazonium salt (B) used in the present invention include p-N-ethyl-N-hydroxyethyl-aminobenzenediazonium zinc chloride salt, 4-(p-tolylmercapto)-2,5-dimethoxy-benzenediazonium zinc chloride salt, 4-(p-tolylmercapto)-2,5-diethoxy-benzenediazonium zinc chloride or boron tetrafluoride salt, 4-(p-methyl-benzoylamino)-2,5-diethoxy-benzenediazonium zinc chloride salt, 4-benzamide-2,5-dibutoxy-benzendiazonium chloride ½ zinc chloride salt, 4-(N-cyclohexyl-N-methylamino)-3-chlorobenzene diazonium chloride ½ zinc chloride salt, 1-diazo-3-chloro-4-N,N-diethylamino-benzene chloride ½ zinc chloride salt, 1-diazo-2,5-diethoxy-4-benzoylamino-benzene chloride ½ zinc salt, 1-diazo-4-(N-ethyl-N-benzyl)amino-benzene chloride ½ zinc chloride salt, 1-diazo-2,5-dimethoxy-4-p-tolylmercapto-benzene chloride ½ zinc chloride salt, 1-diazo-2,5-diethoxy-4-p-tolylmercapto-benzene chloride ½ zinc salt, 1-diazo-3-ethoxy-4-N-methyl-N-benzylamino-benzene chloride ½ zinc salt, 1-diazo-3-chloro-4-N,N-diethylamino-benzene chloride ½ zinc salt, 1-diazo-2,5-diethoxy-4-p-tolylamino-benzene chloride ½ zinc salt, 1-diazo-3-chloro-4-N-methyl-N-cyclohexylamino-benzene chloride ½ zinc chloride salt, 2,5-diethoxy-4-morpholinobenzenediazonium boron tetrafluoride salt, and so on.

In alkali development, these diazonium salts fulfill the function of hardening the resin binder in the unexposed areas and simultaneously reacting with the resin binder to cause color development. The diazonium salt is added in an amount of 3 to 30 weight parts per 100 weight parts of the resin binder. If the amount is less than 3 weight parts, hardening in the unexposed areas is insufficient. On the other hand, if it is more than 30 weight parts, the solubility of the diazonium salt in the resin binder is reduced and, after the photosensitive layer is coated and dried, the diazonium salt bleeds out from the surface of coated film and decreases the solubility of the exposed areas in the developing solution.

If necessary, one or more known stabilizing agents may be used which stabilize the abovementioned diazonium salt.

These components are dissolved in water as solvent, coated on a base material having a smooth or mat-like surface, and dried with warm air at a temperature less than 100° C. to form a photosensitive layer with a film thickness of 2–10μ. In order to control the adhesive strength between the base material and the photosensitive layer, a suitable intermediate layer may be formed on the base material. Examples of the base material used in the present invention include sheet materials of thermoplastic or thermosetting polymers, glasses, metals, and so on. The thermoplastic polymers include synthetic resins such as polyethyleneterephthalate, polycarbonate, polyamide, polypropylene, polyvinylchloride, polystyrene, polymethacrylate, and their copolymers as well as cellulose derivatives such as diacetylcellulose, triacetylcellulose, propylcellulose, and mixed cellulose esters.

The base material may also include additives such as dyes, pigments, fillers, etc. to improve drawing and coloring properties.

The base material is generally used in the form of trannsparent sheets, but it may be used in other forms.

An aqueous alkali solution having a pH value of 12.0–12.8 is used for the development of the photosensitive material. Aqueous solutions of strong alkali such as potassium hydroxide and sodium hydroxide are preferably used for development.

When the diazonium salt reacts with the vinylic polymer compound (A) in the presence of the alkali, color development occurs and a hard layer is formed on the unexposed areas.

A coupler which reacts with the diazonium salt (B) to form an azo dye, may be added to the aqueous alkali solution to provide a more densified color development.

Suitable couplers include 2,3-dihydroxynaphthalene, 2,4-2′,4′-tetrahydroxydiphenyl, phloroglucinol, acetoacetoglycineamide, acetoacetobenzylamide, cyanoacetomorpholide, 1,10-dicyanoacetotriethylenetetramine, 1,4-bis-acetoacetoethylenediamine, 1-phenyl-3-methyl-5-pyrazolone, etc.

After the photosensitive material in the present invention is exposed in the usual manner, for example, by placing a manuscript between a ultraviolet source and the photosensitive material, it is developed by immersing it in a developing solution at room temperature for 0.5–2 minutes to harden the unexposed areas and then removing the exposed areas by water washing.

The time of development can be quickened by raising the temperature of development.

In order to obtain a relief image having high density, it can be immersed and dyed in a solution of a dye which is easily adsorbed into the relief image.

If the dye can be dissolved in the developing solution, this dyeing can be carried out simultaneously with development.

Examples of suitable dyes include Acidol blueblack 10B, Acidol orange M-RL, Acidol black M-SRL, Congo red, etc., but other water soluble dyes can be used.

Water washing can be performed easily with city water or shower of up to 3.0 kg/cm$^2$.

The sheet material developed in the above-described manner is suitably used as a mask plate in map printing where high accuracy is required, because the relief image is faithful to the manuscript from which it was formed.

The photosensitive film formed according to the present invention has excellent flexibility and toughness which can not be realized in conventional positive type photosensitive materials. Further the film with the formed image can be stripped off from a base, and is suitable for use as a mask plate for photography.

The present invention will be further explained by the following Examples.

EXAMPLE 1

[Synthesis of the vinylic polymer compound]

A flask equipped with a stirrer was charged with 1000 g of glacial acetic acid, and then with 50 g of a completely saponified polyvinyl alcohol having an average polymerization degree of 2000 and 30 g of p-hydroxybenzaldehyde. After 25 ml of 20% sulfuric acid was added, the flask contents were stirred and dissolved while raising the temperature to 50° C.

By stirring for 10 minutes, the reaction system became brown and transparent and the viscosity increased.

After stirring for 3.5 hours, the reaction solution was poured into water to obtain a fiber-like polymer. The yield after washing and drying was about 32 g. The approximate structure of the polymer was as follows.

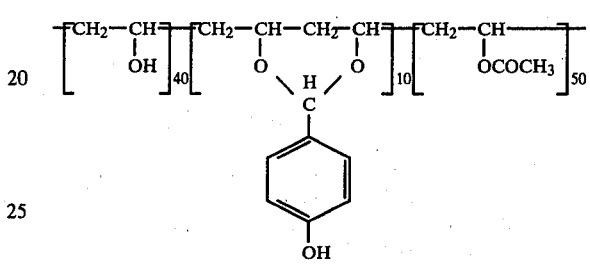

[Production of the potosensitive material]

Into 90 g of methyl cellosolve were dissolved 10 g of the vinylic polymer compound and 1.0 g of 1-diazo-3-chloro-4-N,N-diethylamino-benzene chloride ½ zinc chloride salt to obtain a photosensitive composition having a solids content of 10.9%.

The photosensitive composition was coated on one side of polyethyleneterephthalate film with a thickness of 100μ by means of a wirebar so that the thickness of coated film after drying would become 5μ, and the coated film was dried for 3 minutes at 90° C. to give a photosensitive material.

[Formation of the positive relief image]

A positive manuscript was brought into intimate contact with the obtained photosensitive film, which was then exposed by irradiating with a 3 kw arc light from a distance of 75 cm for 5 minutes.

The photosensitive material thus exposed was immersed for 3 minutes in a developing solution which was obtained by dissolving 3 g of sodium hydroxide in 997 g of water, and simply shower washed with city water.

The photosensitive film in the exposed areas was removed and a sharp positive relief image having sepia color was obtained.

EXAMPLE 2

In the same manner as in Example 1, the completely saponified polyvinyl alcohol having an average polymerization degree of 2000 was converted to the vinylic polymer compound having the following structure.

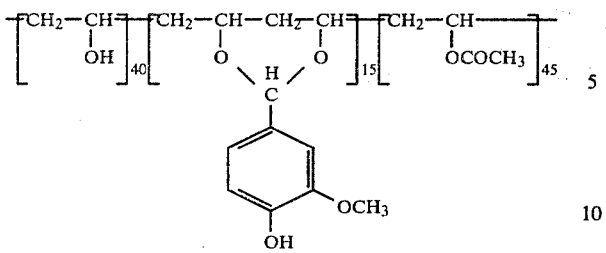

Into 90 g of methyl cellosolve were dissolved 10 g of the vinylic polymer compound and 1.0 g of 1-diazo-3-chloro-4-N,N-diethylamino-benzene chloride ½ zinc chloride salt to obtain a photosensitive composition having a solids content of 10.9%.

The photosensitive composition was coated onto one side of a polyethyleneterephthalate film with a thickness of 100μ by means of a wirebar so that the thickness of coated film after dryness would become 5μ, and the coated film was dried for 3 minutes at 90° C. to give a photosensitive material. The photosensitive material was exposed with ultraviolet light, developed and washed with water in the same manner as in Example 1 to obtain a sepia colored sharp positive relief image.

EXAMPLE 3

Into 90 g of methyl cellosolve were dissolved 10 g of the same vinylic polymer compound as used in Example 1 and 1.0 g of 2,5-diethoxy-4-morpholinobenzenediazonium boron tetrafluoride salt to give a photosensitive composition having a solids content of 10.9%.

In the same manner as in Example 1, the photosensitive composition was coated onto a polyethyleneterephthalate film and dried to obtain a photosensitive material. The photosensitive material was exposed with ultraviolet light, developed and washed with water to obtain a positive relief image. The image was immersed and dyed for 5 minutes in a solution of 3 g of Acidol black M-SRL in 97 g of water to give a good black image with a photographic density of 2.5.

EXAMPLE 4

Into 90 g of methyl cellosolve were dissolved 10 g of the same vinylic polymer compound as used in Example 1, 1 g of 4-(p-methyl-benzoylamino)-2,5-diethoxybenzenediazonium zinc chloride salt and 0.8 g of Orazol pink 5BLG to prepare a photosensitive composition with a solids content of 10.9%.

The photosensitive composition was coated onto one side of a polyethyleneterephthalate film with a thickness of 100μ by means of a wirebar so that the thickness of coated film after dryness would become 8μ, and dried for 3 minutes at 90° C. to give a photosensitive material.

A positive manuscript was brought into intimate contact with the thus obtained photosensitive film, which was then exposed by irradiating with a 3 kw arc light from a distance of 75 cm for 8 minutes.

The photosensitive material thus exposed was immersed for 3 minutes in the same developing solution as in Example 1 and shower washed with city water.

The photosensitive film in the exposed areas was removed and a red sharp positive relief image with a photographic density of 2.5 was obtained. The relief image could be stripped off selectively from a base film and was useful as a mask material for UV photosensitive materials.

EXAMPLE 5

After the photosensitive material used in Example 1 was exposed with ultraviolet ray through a manuscript, it was immersed for 3 minutes in a developing solution which was obtained by dissolving 3 g of sodium hydroxide and 3 g of 2,4-2',4'-tetraoxydiphenyl sulfide in 994 g of water, and simply shower washed with city water. The thus obtained positive relief image had a higher density than that obtained in Example 1, i.e. and the photographic density was 2.3.

What is claimed is:

1. A positive-working photosensitive material comprising: (1) a base material and (2) a layer of photosensitive composition formed on said base material and comprising (A), 100 weight parts of a resin binder containing at least 50 weight % of a vinylic polymer compound having an average polymerization degree of 300-2600 and represented by the general formula:

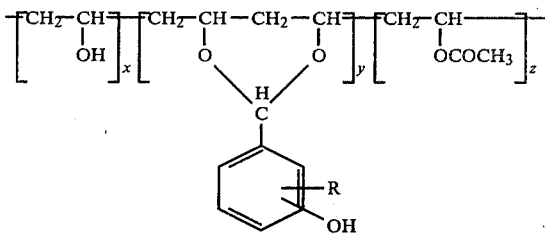

wherein R represents hydrogen, hydroxyl, carboxyl, alkyl, alkoxyl, aryl, nitro, amino or halogen; and having a copolymerization ratio of x:y:z of 5–50:5–85:10–60 and (B), 3–30 weight parts of an aromatic diazonium salt having only a single diazo group.

2. A positive-working photosensitive material according to claim 1, wherein the copolymerization ratio of x:y:z in the vinylic polymer compound is 10-45-:7-70:20-25.

3. A positive-working photosensitive material according to claim 1 or 2, wherein the base material is a sheet material of a thermoplastic or thermosetting polymer, metal or glass.

4. A process for developing a positive-working photosensitive material comprising:
providing a base material;
forming on said base material a layer of a photosensitive composition comprising (A), 100 weight parts of a resin binder containing at least 50 weight % of a vinylic polymer compound having an average polymerization degree of 300-2600 and represented by the general formula:

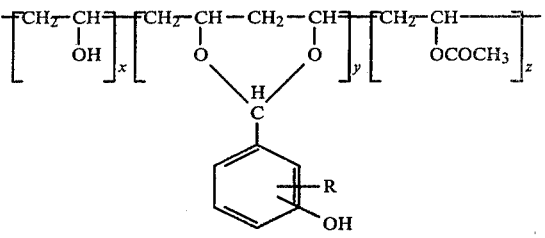

wherein R represents hydrogen, hydroxyl, carboxyl, alkyl, alkoxyl, aryl, nitro, amino or halogen;

and having a copolymerization ratio of x:y:z of 5–50:5–85:10–60 and (B), 3–30 weight parts of an aromatic diazonium salt having only a single diazo group;

bringing said positive-working photosensitive material into intimate contact with a positive manuscript;

exposing said positive-working photosensitive material to radiation through said manuscript; and developing said exposed material by contact with an alkali developer to obtain a positive relief image.

5. A process for developing a photosensitive material according to claim 4, wherein the copolymerization ratio of x:y:z in the vinylic polymer compound is 10–45-:7–70:20–55.

6. A process for developing a photosensitive material according to claim 4, wherein an aqueous alkali solution has a pH of 12.0–12.8.

7. A process for developing a photosensitive material according to claim 4 or 5, wherein a coupler which reacts with the water soluble diazonium salt (B) to form an azo dye is dissolved in an aqueous alkali solution.

* * * * *